(12) United States Patent
Verma (10) Patent No.: US 11,601,133 B2
(45) Date of Patent: Mar. 7, 2023

(54) SYSTEM AND METHOD OF PERFORMING DISCRETE FREQUENCY TRANSFORM FOR RECEIVERS USING SINGLE-BIT ANALOG TO DIGITAL CONVERTERS

(71) Applicant: Silicon Laboratories Inc., Austin, TX (US)

(72) Inventor: Anant Verma, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 310 days.

(21) Appl. No.: 17/081,707

(22) Filed: Oct. 27, 2020

(65) Prior Publication Data

US 2022/0131548 A1   Apr. 28, 2022

(51) Int. Cl.
| | |
|---|---|
| *H03M 1/00* | (2006.01) |
| *H03M 1/10* | (2006.01) |
| *H03M 1/12* | (2006.01) |
| *G06F 7/50* | (2006.01) |
| *G06F 7/49* | (2006.01) |
| *G06F 7/523* | (2006.01) |
| *G06F 7/72* | (2006.01) |

(52) U.S. Cl.
CPC ............ *H03M 1/1085* (2013.01); *G06F 7/49* (2013.01); *G06F 7/50* (2013.01); *G06F 7/523* (2013.01); *G06F 7/72* (2013.01); *H03M 1/1205* (2013.01); *H03M 1/1245* (2013.01)

(58) Field of Classification Search
CPC ................................ H03M 1/1085; G06F 7/50
USPC ................................. 341/126, 155, 122, 111
See application file for complete search history.

(56) References Cited

U.S. PATENT DOCUMENTS

| | | | | |
|---|---|---|---|---|
| 4,222,050 A | * | 9/1980 | Kiuchi .................... | G01S 7/292 342/194 |
| 8,660,170 B1 | * | 2/2014 | Huynh .................... | H03M 3/38 375/224 |
| 2015/0263873 A1 | * | 9/2015 | Casagrande .......... | H04L 27/227 375/323 |

* cited by examiner

*Primary Examiner* — Peguy Jean Pierre
(74) *Attorney, Agent, or Firm* — Gary Stanford; Huffman Law Group, PC (57) ABSTRACT

A system and method for performing discrete frequency transform including a pair of single-bit analog to digital converters (ADCs), a phase converter, a memory, a discrete frequency transform converter and summation circuitry. The ADCs convert an analog input signal into N pairs of binary in-phase and quadrature component samples each being one of four values at a corresponding one of four phases. The phase converter determines a phase value for each pair of component samples. The memory stores a set of discrete frequency transform coefficient values based on N. The discrete frequency transform converter uses a phase value and a pair of discrete frequency transform coefficient values retrieved from the memory for a selected frequency bin to determine a discrete frequency component for each pair of phase component samples. The summation circuitry sums the corresponding N frequency domain components for determining a frequency domain value for the selected frequency bin.

20 Claims, 7 Drawing Sheets

DFT COEFFICIENTS

SYSTEM AND METHOD OF PERFORMING DISCRETE FREQUENCY TRANSFORM FOR RECEIVERS USING SINGLE-BIT ANALOG TO DIGITAL CONVERTERS

BACKGROUND OF THE INVENTION

Field of the Invention

The present invention relates in general to communication processing, and more particularly to a system and method of performing efficient discrete frequency transform for receivers that use single-bit analog to digital converters.

Description of the Related Art

A transmitted signal received by a receiver undergoes various conversions including multiple signal processing algorithms. In a wireless configuration, a wireless radio frequency (RF) signal received by a receive (RX) circuit or chain of a wireless receiver is usually provided to a mixer or the like to down convert the RF signal into an analog signal at an intermediate or baseband frequency level. A similar conversion may occur in wired receivers. The received signal is then sampled by an analog to digital converter (ADC) circuit to generate a corresponding digital signal in the time domain. The time domain digital signal is converted to a frequency domain digital signal with corresponding frequency domain components for further evaluation or processing. Many algorithms exist to perform this conversion, including, for example, Fast Fourier Transform (FFT), Discrete Fourier Transform (DFT), Goertzel's Algorithm, etc. The computations within these algorithms, however, require a substantial combination of multiply and add operations which are not trivial for even the most efficient algorithms.

The receiver may be tested to ensure that it is functioning correctly and is compliant with applicable requirements. During testing, a test signal may be provided to the receiver under test which processes and converts the signal to digital values in the frequency domain. The frequency information may then be evaluated by determining amplitude and phase information at various frequency points or bins, which conventionally requires a significant number of complex math operations. The conventional methods using complex computations increase testing time and reduce efficiency.

SUMMARY OF THE INVENTION

A system for performing discrete frequency transform according to one embodiment includes first and second single-bit analog to digital converters (ADCs), a phase converter, a memory, a discrete frequency transform converter and summation circuitry. The ADCs convert an analog input signal into N pairs of binary in-phase and quadrature component samples each being one of four values at a corresponding one of four phases. The phase converter determines a phase value for each pair of component samples. The memory stores a set of discrete frequency transform coefficient values based on N. The discrete frequency transform converter uses a corresponding phase value and a corresponding pair of discrete frequency transform coefficient values retrieved from the memory for a selected frequency bin to determine a corresponding discrete frequency component for each pair of phase component samples. The summation circuitry sums the corresponding N frequency domain components to provide a complex summation value used for determining a frequency domain value for the selected frequency bin.

In one embodiment, the discrete frequency transform converter determines an initial index into the memory for a corresponding discrete frequency transform coefficient, adjusts the index by adding a phase offset to the initial index based on the phase value to determine an adjusted index, and retrieves a real transform coefficient value and a corresponding imaginary transform coefficient value from the memory using the adjusted index.

In one embodiment, the memory stores a full set of discrete frequency transform coefficients including a cosine value and a corresponding negative sine value for each value of N. In another embodiment, the memory stores only N/4 real transform coefficient values each corresponding one of N/4 component samples. In this case, the discrete frequency transform converter applies a first modulo function to the adjusted index to determine a quadrant value, applies a second modulo function to the adjusted index to determine a quarter-wave index, uses the quarter-wave index and negated version of the quarter-wave index to retrieve first and second components from the memory, and uses the quadrant value to determine the real transform coefficient value and the corresponding imaginary transform coefficient value.

In one embodiment, each ADC outputs a binary value 1 or −1, so that each pair of binary in-phase and quadrature component samples is one of [1, 1] at a phase of 45 degrees, [−1, 1] at a phase of 135 degrees, [−1, −1] at a phase of 225 degrees, and [1, −1] at a phase of 315 degrees, each having a magnitude of $\sqrt{2}$. The complex summation value includes a real component and an imaginary component, in which scaling circuitry may be provided to multiply each of the real and imaginary components by $\sqrt{2}$.

In another embodiment, the discrete frequency transform converter determines an index into the memory for a corresponding discrete frequency transform coefficient, retrieves a real transform coefficient value and a corresponding transform coefficient imaginary value from the memory using the index, and selectively adjusts the real transform coefficient value and the imaginary transform coefficient value based on the phase value.

In one embodiment, the memory stores a full set of discrete frequency transform coefficients including a cosine value and a corresponding negative sine value for each value of N. In another embodiment, the memory stores only N/4 real transform coefficient values each corresponding one of N/4 component samples, in which the discrete frequency transform converter applies a first modulo function to the index to determine a quadrant value, applies a second modulo function to the index to determine a quarter-wave index, and uses the quarter-wave index and negated version of the quarter-wave index to retrieve first and second components from the memory.

In one embodiment, the discrete frequency transform determines the real transform coefficient value and the imaginary transform coefficient value by using the retrieved first and second components retrieved from the memory for a phase value of 1, swaps the first and second components and then negates the real component for a phase of j, negates both the first and second components for a phase of −1, and swaps the first and second components and then negates the imaginary component for a phase of −j.

In one embodiment, each ADC outputs a binary value 1 or −1, and each pair of binary in-phase and quadrature component samples is rotated by −45 degrees to one of [1, 0] at a phase of 0 degrees, [0, 1] at a phase of 90 degrees,

[-1, 0] at a phase of 180 degrees, and [0, -1] at a phase of 270 degrees. The complex summation value may include a real component and an imaginary component, in which the system may further include scaling and rotation circuitry that provides the frequency domain value by subtracting the imaginary component of the complex summation value from the real component of the complex summation value to provide a real component of the frequency domain value, and by adding the real and imaginary components of the complex summation value to provide an imaginary component of the frequency domain value.

A method of performing discrete frequency transform according to one embodiment includes converting an analog input signal into N pairs of binary in-phase and quadrature component samples, in which N is a predetermined number of samples and in which each pair of phase component samples is one of four values at a corresponding one of four phases, determining a phase value for each of the component samples, storing a set of discrete frequency transform coefficient values based on N, using a corresponding phase value and a corresponding pair of discrete frequency transform coefficient values retrieved from the memory for a selected frequency bin for determining a corresponding discrete frequency component for each of the N pairs of binary in-phase and quadrature phase component samples, and summing the corresponding N frequency domain components for providing a complex summation value used for determining a frequency domain value for the selected frequency bin.

The method may include determining an initial index into the memory for a corresponding discrete frequency transform coefficient, adjusting the index by adding a phase offset to the initial index based on the phase value for determining an adjusted index, and retrieving a real transform coefficient value and a corresponding imaginary transform coefficient value from the memory using the adjusted index.

The storing may include storing only N/4 real transform coefficient values each corresponding one of N/4 component samples, applying a first modulo function to the adjusted index for determining a quadrant value, applying a second modulo function to the adjusted index for determining a quarter-wave index, using the quarter-wave index and negated version of the quarter-wave index for retrieving first and second components from the memory, and using the quadrant value for determining the real transform coefficient value and the corresponding imaginary transform coefficient value.

The method may include converting by providing a binary value 1 or -1 so that each pair of binary in-phase and quadrature component samples is one of [1, 1] at a phase of 45 degrees, [-1, 1] at a phase of 135 degrees, [-1, -1] at a phase of 225 degrees, and [1, -1] at a phase of 315 degrees, each having a magnitude of $\sqrt{2}$. The complex summation value may include a real component and an imaginary component, in which the method may include multiplying each of the real component and the imaginary component by $\sqrt{2}$.

The method may include determining an index into the memory for a corresponding discrete frequency transform coefficient, retrieving a real transform coefficient value and a corresponding transform coefficient imaginary value from the memory using the index, and selectively adjusting the real transform coefficient value and the imaginary transform coefficient value based on the phase value. The storing may include storing only N/4 real transform coefficient values each corresponding one of N/4 component samples, in which the method further includes applying a first modulo function to the index for determining a quadrant value, applying a second modulo function to the index for determining a quarter-wave index, and using the quarter-wave index and negated version of the quarter-wave index for retrieving first and second components from the memory.

The method may include determining the real transform coefficient value and the imaginary transform coefficient value by using the retrieved first and second components retrieved from the memory for a phase value of 1, swapping the first and second components and then negating the real component for a phase of j, negating both the first and second components for a phase of -1, and swapping the first and second components and then negates the imaginary component for a phase of -j.

The method may include converting by providing a binary value 1 or -1, in which the method may further include rotating each pair of binary in-phase and quadrature component samples by -45 degrees to one of [1, 0] at a phase of 0 degrees, [0, 1] at a phase of 90 degrees, [-1, 0] at a phase of 180 degrees, and [0, -1] at a phase of 270 degrees. The complex summation value may include a real component and an imaginary component, in which the method may include providing the frequency domain value by subtracting the imaginary component of the complex summation value from the real component of the complex summation value for providing a real component of the frequency domain value, and by adding the real and imaginary components of the complex summation value for providing an imaginary component of the frequency domain value.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventor has recognized the need to improve the efficiency of the frequency conversion for communication systems particularly those that use single-bit analog to digital converters (ADCs). He has therefore developed a system and method of efficient discrete frequency transform using single-bit ADCs to provide frequency information that may be used for various purposes including test and evaluation.

Figure 1:
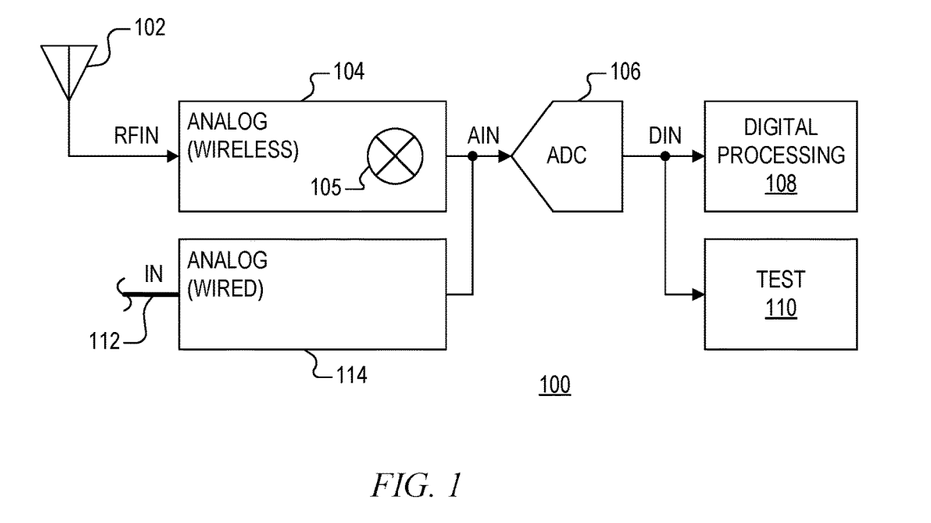
FIG. 1 is a simplified block diagram of a receiver including test circuitry implemented according to one embodiment of the present disclosure.

FIG. 1 is a simplified block diagram of a receiver 100 including test circuitry 110 implemented according to one embodiment of the present disclosure. The receiver 100 may be configured for wireless communications, wired communications, or a combination of both. For wireless communications, an antenna 102 captures and provides a received wireless radio frequency (RF) input signal (RFIN) to an input of analog circuitry 104, which converts RFIN to an analog input (AIN) signal. The AIN signal is provided to an input of an analog-to-digital converter (ADC) 106, which converts the AIN signal to a digital input (DIN) signal. The DIN signal is provided to a digital processing circuit 108, which generally represents the digital portion of the receiver 100. The digital processing circuit 108 extracts the transmitted signal and includes various digital processing circuits (not shown), such as, for example, a digital or channel filter or the like, a received signal strength indication (RSSI) circuit or the like, a microcontroller or processor or the like, etc.

The analog circuitry 104 for the wireless configuration is simplified may include additional circuitry (not shown) coupled to the antenna 102, such as a matching network, a passive gain network, etc. The analog circuitry 104 may also include other circuitry not shown, such as one or more low-noise amplifiers, one or more programmable gain amplifiers, one or more level detectors or peak detectors, transimpedance amplifiers, low-pass filters, etc. The analog circuit 104 also includes a mixer circuit 105 or the like that mixes the RFIN signal with a local oscillator (LO) signal or the like (not shown) to convert AIN to an intermediate frequency (IF) signal or a baseband signal or the like. The wireless configuration may be implemented according to any one of several different wireless standards, architectures, or protocols, such as ZigBee, Thread, Z-wave, low-energy BlueTooth (BLE), etc., for operating in networks that provide a low data transfer rate, energy efficiency and secure networking. These protocols, which are based on IEEE 802.15.4, operate in the 2.4 Gigahertz (GHz) industrial, scientific, and medical radio (ISM) band. The receiver 100 may alternatively be configured according to any type of Wi-Fi device according to any one of the various IEEE 802.11 standards, such as 802.11a, 802.11b, 802.11g, 802.11n, etc., operating in the 2.4 GHz or the 5 GHz band or the like. Various Frequency Modulation (FM) radio configurations are also contemplated.

In a wired configuration, an input signal IN received on a cable 112 is provided to analog circuitry 114 that may include similar conditioning circuitry for converting IN to the AIN signal provided to the ADC 106. The form of the cable 112 depends on the particular type of wired communications, such as a coaxial cable, an ethernet cable, an optical cable, etc. For both wired and wireless configurations, the analog circuitry 104 or 112 of the receiver 100 also include both an in-phase portion and a quadrature-phase phase portion, and may include an automatic gain control (AGC) circuit (not shown) or the like for controlling gain of the received signal to within an amplitude or magnitude range of the ADC 106.

The DIN signal may also be provided to test circuitry 110 for purposes of testing functionality or compliancy with standards or the like. The receiver 100 may be incorporated within a System-on-Chip (SoC) configuration or the like plugged into a test apparatus and exposed to one or more test signals received by the antenna 102 or the cable 112. In one embodiment, the test circuitry 110 may be part of the test apparatus configured to externally receive DIN from the SoC. In another embodiment, the test circuitry 110 may be incorporated within the same SoC configuration and activated during a test mode or the like.

Figure 2:
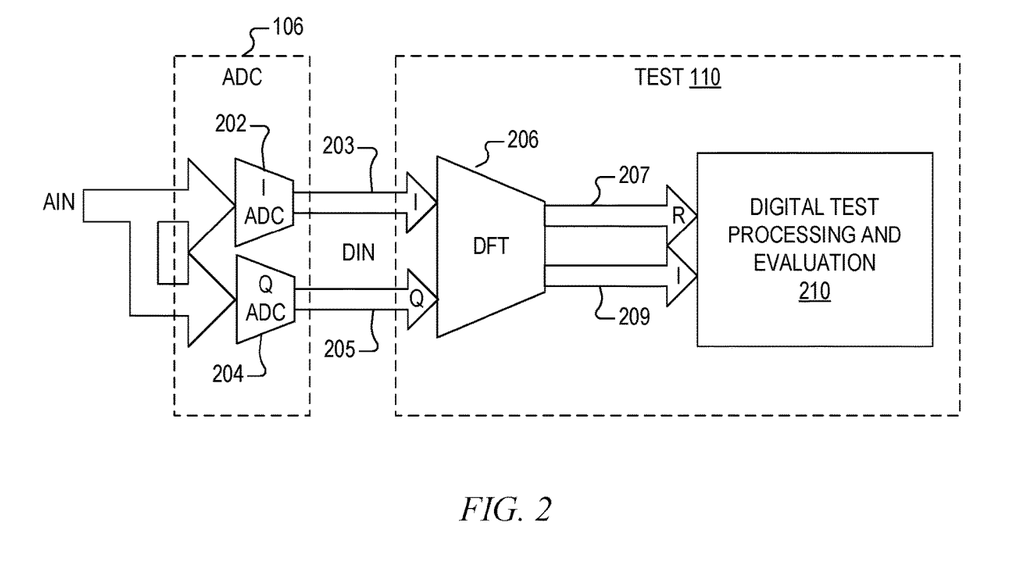
FIG. 2 is a more detailed block diagram of the ADC and the test circuitry of the receiver of FIG. 1 for processing the analog input signal according one embodiment of the present disclosure.

FIG. 2 is a more detailed block diagram of the ADC 106 and the test circuitry 110 of the receiver 100 for processing the AIN signal according one embodiment of the present disclosure. The ADC 106 includes an in-phase (I) ADC 202 and a quadrature-phase (Q) ADC 204 for converting the AIN signal into the DIN signal including I and Q samples on I and Q buses 203 and 205, respectively. The AIN and DIN signals are both time domain signals in which the DIN signal includes complex time domain samples of the AIN signal. The I bus 203 provides the I samples and the Q bus 205 provides the Q samples to corresponding inputs of Discrete Fourier Transform (DFT) circuitry 206. The DFT circuitry 206 performs a DFT conversion process as further described herein to provide at least one frequency domain value including a real frequency component on a first bus 207 and an imaginary frequency component on a second bus 209. The one or more frequency domain values are provided to digital test processing and evaluation circuitry 210, which is not further described.

The DFT circuitry 206 converts the I and Q samples in the time domain to frequency information in the frequency domain according to the following equation (1):

$$X(n) = \sum_{k=0}^{N-1} x(k) e^{-j2\pi kn/N} \qquad (1)$$

in which X(n) denotes the frequency domain value at a selected frequency bin "n", "N" denotes a predetermined number of samples, "k" is an index from 0 to N−1, x(k) denotes the kth digital time sample of the received signal, and $e^{-j2\pi kn/N}$ denotes a corresponding discrete DFT complex coefficient for the kth digital time sample. It is noted that the present disclosure denotes imaginary numbers using unit "j" which is understood to be interchangeable with standard notation unit "i", in which both represent $\sqrt{-1}$. In this manner, as the index k is incremented from 0 to N−1 for a selected frequency bin n, each sample x(k) is multiplied by a corresponding DFT coefficient $e^{-j2\pi kn/N}$ and the resulting discrete complex frequency components are summed together for the total number of samples to determine the corresponding frequency domain value X(n) for the selected frequency bin. The digital time samples x(k) and the corresponding discrete DFT coefficients are both complex numbers, each with amplitude and phase values (polar coordinates) or real and imaginary components (Cartesian coordinates) so that the process for determining X(n) conventionally includes a significant number of complex multiply and add operations.

As described further herein, the DFT coefficients each have a unity magnitude (magnitude of 1) with a phase that advances around a complex unit circle as the index k is incremented from 0 to N−1. The discrete time samples x(k) appear to change in a random manner based on the received signal. When the ADCs 202 and 204 are multi-bit ADCs, then the samples x(k) have varying amplitudes and phases. When the ADCs 202 and 204 are single-bit ADCs, however, then the amplitudes remain fixed while the phase varies from one sample to the next. In one embodiment, each of the ADCs 202 and 204 may be single-bit delta-sigma modulators (DSM), although alternative types of ADCs are contemplated. Since the amplitudes of the samples are fixed for single-bit ADCs and since the amplitudes of DFT coefficients have unity value, then the DFT circuitry 206 may be configured so that the determination of each discrete frequency component, which is normally performed using complex multiplication, may instead be achieved by simple digital manipulation and selection of a stored DFT coefficient.

The DFT coefficients may be predetermined and stored in a memory, such as a look-up table (LUT) or the like. As the index k is incremented for a selected frequency bin n, an index value is updated to effectively point to or address the next stored DFT coefficient in the memory. In a first embodiment, rather than retrieving the next stored DFT and actually multiplying the retrieved DFT coefficient by the next corresponding sample x(k), the sample x(k) is used instead to determine a corresponding phase adjustment which is used to adjust the memory index value to select a different DFT coefficient as the next discrete frequency component. In this manner, the index value adjustment is achieved by simply addition of singular values, so that multiplication of complex values is avoided. In a second embodiment, the set of x(k) values are selected to limit the phase adjustment to +/−1 or +/−j corresponding to phase adjustments of increments of 90 degrees (°) on a complex plane. In this case, the index value is not adjusted but instead is used to retrieve the next DFT coefficient, and the phase adjustment is a simple digital manipulation as further described here to derive the next discrete frequency component. Again, multiplication of complex numbers is entirely avoided.

Figure 3:
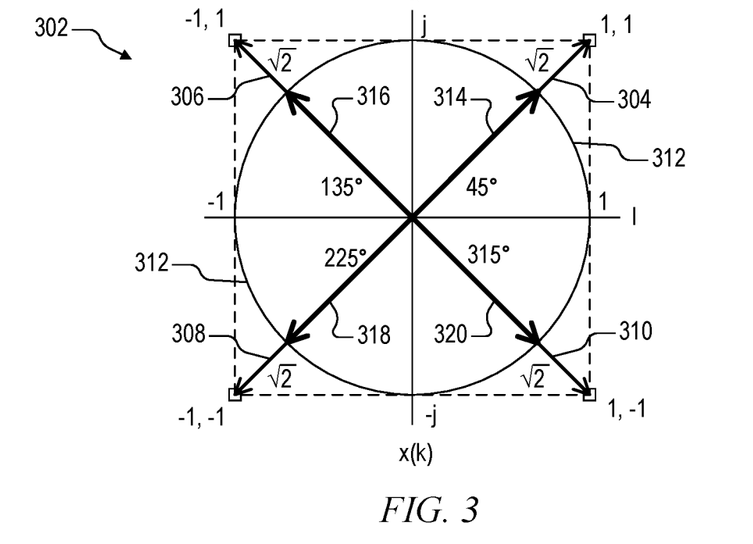
FIG. 3 is a graphic diagram plotting the four possible discrete x(k) samples on an I, Q complex plane using single-bit ADCs according to one embodiment of the present disclosure.

FIG. 3 is a graphic diagram 302 plotting the four possible discrete x(k) samples on an I, Q complex plane using single-bit ADCs according to one embodiment of the present disclosure. As shown, the x(k) samples assume only one of four possible outputs of the ADC 106 using the single-bit ADCs 202 and 204 that are each configured to output binary values of 1 or −1. The graph 302 plots the I component or the "real" component output from the ADC 202 on the horizontal or x-axis as being either 1 or −1, and plots the corresponding Q component or "imaginary" component output from the ADC 204 on the vertical or y-axis as being either 1 or −1 corresponding with j or −j, respectively, along the imaginary axis. Thus, the combined output from the ADC 106 in this configuration is only one of 4 samples [1, 1], [−1, 1], [−1, −1], and [1, −1] shown at 304, 306, 308, and 310, respectively, at corresponding phases (or rotations) of 45°, 135°, 225°, and 315°, respectively.

As shown, the magnitude of each x(k) sample is not unitary but instead each x(k) sample has a magnitude of $\sqrt{2}$. Also plotted is a complex unit circle 312 having a unitary radius indicative of a unitary amplitude. As described herein, the magnitude of each sample may instead be treated as having a unitary amplitude as shown as 314, 316, 318, and 320, respectively, effectively applying a "virtual" scaling factor of $1/\sqrt{2}$. After DFT transformation is achieved to provide a scaled or otherwise unadjusted frequency domain value, a scaling factor of $\sqrt{2}$ may then be applied if desired to provide the final frequency domain value.

Figure 4:
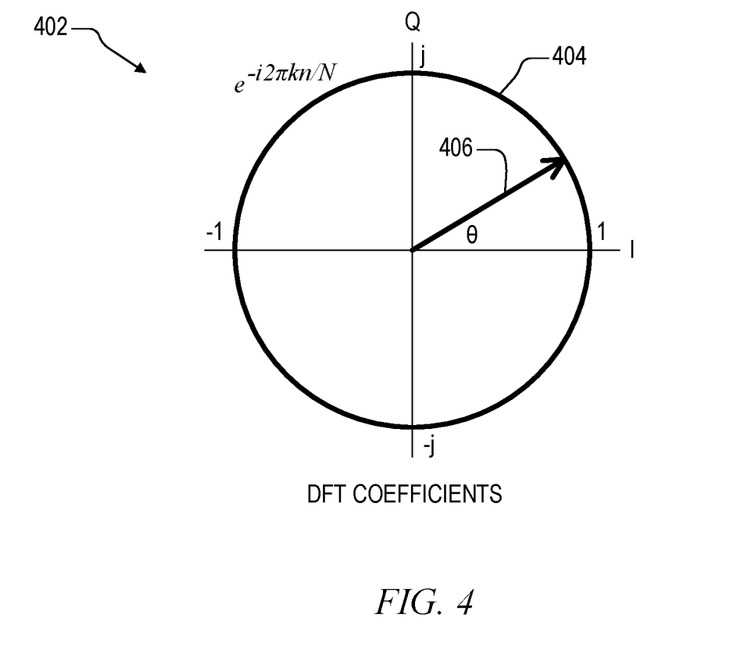
FIG. 4 is a graphic diagram illustrating the DFT coefficients $e^{-j2\pi kn/N}$ plotted along a complex unit circle within an I, Q complex plane according to one embodiment of the present disclosure.

FIG. 4 is a graphic diagram 402 illustrating the DFT coefficients $e^{-j2\pi kn/N}$ plotted along a complex unit circle 404 within an I, Q complex plane according to one embodiment of the present disclosure. Only one DFT coefficient is explicitly illustrated by an arrow 406, in which it is understood that the remaining DFT coefficients are equally distributed along the complex unit circle 404. Each DFT coefficient has a unitary amplitude and has a phase θ that varies depending upon the value of the selected frequency bin n, the total number of samples N, and the value of the index k. It is noted that for given values of N and n, each successive kth term provides a phase rotation of $2\pi n/N$. Also, for a given value of N, $2\pi/N$ is the minimum phase change around the complex unit circle 404. Once n is fixed, then each successive increment of k steps by n units of the minimum phase.

As illustrated by equation (1), the frequency domain value X(n) for a given frequency bin n is determined by multiplying each kth sample x(k) by the kth DFT coefficient and summing the result. Each x(k) sample is only one of four values, including sample [1, 1] for a phase of 45° corresponding to $1+j=\sqrt{2}e^{j2\pi/8}$, sample [−1, 1] for a phase of 135° corresponding to $-1+j=\sqrt{2}e^{j3*2\pi/8}$, sample [−1, −1] for a phase of 225° corresponding to $-1-j=\sqrt{2}e^{j5*2\pi/8}$, and sample [1, −1] for a phase of 315° corresponding to $1-j=\sqrt{2}e^{j7*2\pi/8}$. Assuming the number of samples $N=2^w$ in which "w" is an integer, then each of the DFT coefficients is a selected one of a limited set of discrete DFT coefficients along the complex unit circle 404. The result of multiplication of the kth DFT coefficient by the corresponding kth sample x(k) is $\sqrt{2}e^{-j2\pi(kn+N/8+Ny/4)/N}$ in which y=[0, 1, 2, 3] representing one of the four possible samples x(k). In this manner, multiplication of the kth DFT coefficient by the corresponding x(k) sample for each factor results in selection of another DFT coefficient that is scaled by the scaling factor $\sqrt{2}$ as previously described.

As previously described, by limiting the x(k) values to only one of four values with four different phases, the discrete frequency component that is determined by actual complex multiplication is simply a scaled version of a different one of a limited set of discrete DFT coefficients. In this manner, a memory, such as an LUT or the like (see, e.g., coefficient memory 710 shown in FIG. 7), can be used to store the limited set of DFT coefficients in which the phase information is used to select the DFT coefficient that corresponds with the frequency component. In this manner, each discrete frequency component can be retrieved from the memory using phase information rather than actually doing the complex multiplication as further described herein. Since the scaling factor $\sqrt{2}$ is common to all of the frequency components, it may be ignored during summation of the individual components and applied at the end as further described herein.

Figure 5:
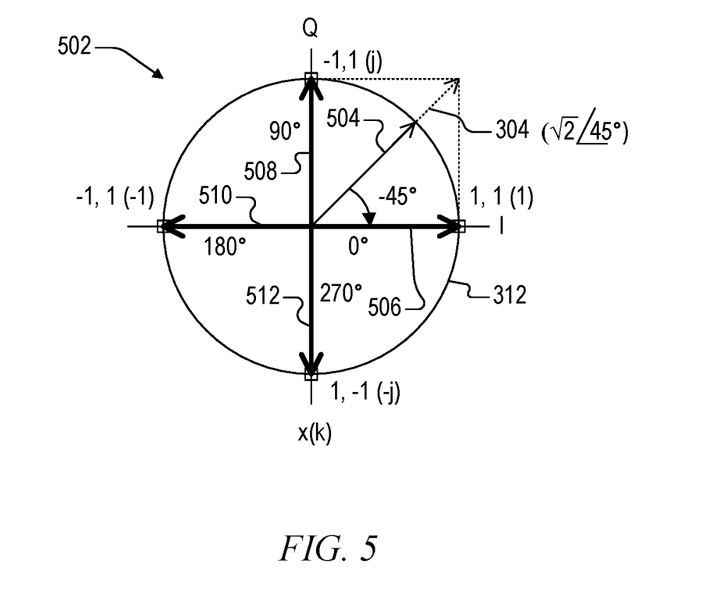
FIG. 5 is a graphic diagram plotting an alternative set of four x(k) samples on an I, Q complex plane according to another embodiment of the present disclosure.

FIG. 5 is a graphic diagram 502 plotting an alternative set of four x(k) samples on an I, Q complex plane according to another embodiment of the present disclosure. The complex unit circle 312 is also plotted for reference. Graph 502 plots four possible outputs of the ADC 106 using the single-bit ADCs 202 and 204 that are each configured to output binary values of 1 or −1 in the same manner previously described. In this case, however, the 4 values [1, 1], [−1, 1], [−1, −1], or [1, −1] are each rotated by −45° to different phases 0°, 90°, 180°, and 270°, and the magnitudes of each output is scaled to unitary magnitudes effectively applying a scaling factor of $1/\sqrt{2}$ similar to the first embodiment. As an example, the x(k) sample 304 of the previous configuration is plotted using a dotted line, and a scaled version with unity magnitude is plotted as shown by corresponding scaled sample 504. The scaled sample 504 is then rotated by −45° resulting in corresponding scaled and rotated sample 506 at 0°. The remaining 3 samples are similarly scaled and rotated resulting in four x(k) samples 506 (at 0°), 508 (at 90°), 510 (at 180°), and 512 (at 270°).

The alternative embodiment shown in FIG. 5 is substantially similar to the first embodiment of FIG. 3. First, actually performing complex multiplication between the sample x(k) and the corresponding DFT coefficient simply results in a different one of the same limited set of discrete DFT coefficients, so that the same memory (see, e.g., coefficient memory 710 shown in FIG. 7) can be used to store the limited set of DFT coefficients. The phase adjustment may be applied by adjusting the memory index in a similar manner as with the first embodiment except using different phase values (0°, 90°, 180° and 270° rather than 45°, 135°, 225° and 315°), in which the adjusted memory index is used to retrieve a DFT coefficient as the scaled discrete frequency component. Alternatively, rather than adjust the memory index, the phase adjustment may be applied to the retrieved DFT coefficient as further described herein. Second, the amplitude scaling factor may be virtually applied rather than being actually applied in the same manner as previously described for the embodiment of FIG. 3, in which the scaling factor may be applied as the last step.

As noted above, rather than applying the phase adjustment to the memory index to retrieve a different DFT coefficient, the phase adjustment of the embodiment shown in FIG. 5 may be achieved by retrieving the actual DFT coefficient and then multiplying the retrieved DFT coefficient by 1 (for 0°), j (for 90°), −1 (for 180°), or −j (for 270°). Although the coefficients are complex in format, rather than actually performing complex multiplication, the real and imaginary components may be swapped and/or negated to achieve the desired result. A phase adjustment of 0° means that the retrieved real and imaginary components are multiplied by 1 and thus remain unmodified. A phase adjustment of 90° means that the retrieved real and imaginary components are each multiplied by j such that the coefficients are swapped and then the swapped real value (after swapping) is negated (e.g., rotated_coeff_real=−coeff_imag, and rotated_coeff_imag=coeff_real). A phase adjustment of 180° means that both of the real and imaginary components are multiplied by 1 and thus simply negated. A phase adjustment of 270° means that the retrieved real and imaginary components are multiplied by −j in which the coefficients are swapped and then the swapped imaginary value (after swapping) is negated (e.g, rotated_coeff_real=coeff_imag, and rotated_coeff_imag=−coeff_real). In this manner, rather than employing complex math, each discrete frequency component is determined by retrieving a stored DFT coefficient from the memory and applying phase adjustment using simple digital manipulation of the retrieved values.

Figure 6:
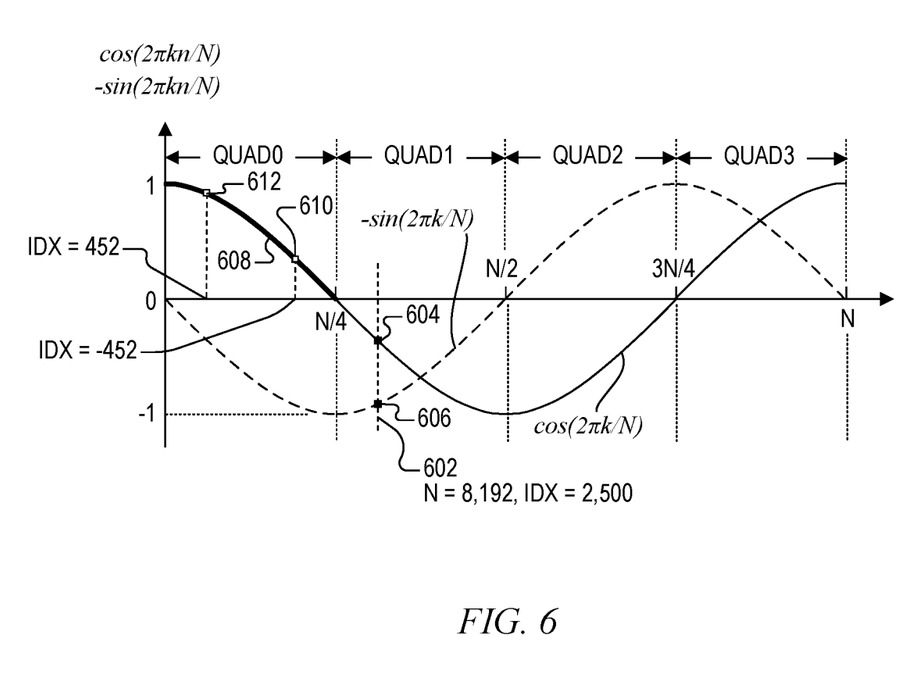
FIG. 6 is a graphic diagram plotting a cosine or real component and a negative sine or imaginary component of the DFT coefficients versus N according to the Euler's formula $e^{-j2\pi n/N} = \cos(2\pi kn/N) - j\sin(2\pi kn/N)$ for n=1.

FIG. 6 is a graphic diagram plotting a cosine (cos) or real component and a negative sine (−sin) or imaginary component of the DFT coefficients versus N according to the Euler's formula $e^{-j2\pi kn/N} = \cos(2\pi kn/N) - j\sin(2\pi kn/N)$ for n=1. The graphic diagram defines all of the possible DFT coefficients as the complex unit circle 404 is traversed. The DFT coefficient values may be determined for an index value IDX ranging from 0 to N−1. The cosine values are plotted using a solid line and the −sine values are plotted using a dashed line. It is noted that discrete cosine and −sine values may be stored in the memory (e.g., LUT or the like) for a given value of IDX. As an example, for N=8,192 and IDX=2,500 as shown at 602, the cosine value shown at 604 is about −0.340 and the −sine value (or the negated sine value) shown at 606 is about −0.941. Each pair of cosine and −sine values at an index IDX for a given value of N can be stored in a LUT in memory with any desired level of accuracy, in which IDX is used as an index into the LUT to access the corresponding cosine and −sine values.

It is appreciated that the number of cosine and −sine values that are stored may be significantly reduced with the recognition of the symmetry of both the cosine and sine waveforms in each of the four quadrants from 0 to 2π (corresponding to 0 to N), in which the quadrants are denoted QUAD0, QUAD1, QUAD2, and QUAD3. The initial quarter-waveform of the cosine waveform in QUAD0 is bolded as shown at 608, in which this quarter-waveform shape is repeated in the second quadrant QUAD1 for the cosine waveform except reversed and negated, is repeated in the third quadrant QUAD2 for the cosine waveform except negated, and is repeated in the fourth quadrant QUAD3 for the cosine waveform except reversed. The −sine waveform also repeats the cosine quarter-waveform in the different quadrants, in which it is repeated in the first quadrant QUAD0 except reversed and negated, is repeated in the second quadrant QUAD1 except negated, is repeated in third quadrant QUAD2 except reversed, and is repeated in fourth quadrant QUAD3 as is. In this manner, an LUT storing the DFT coefficient values may be substantially reduced and the index values modified to retrieve the corresponding value, which may be negated depending upon the applicable quadrant.

For example, the cosine and −sine values for IDX=2,500 located in the second quadrant QUAD1 may instead be retrieved from corresponding quarter-waveform cosine values stored for the first quadrant QUAD0, which includes cosine values for IDX=0 to 2,048 (N/4). Thus, for the cosine value for k=2,500, rather than use index 2,500 which extends into the second quadrant by 452 (2,500−2,048), a negated index of −452 may be used which corresponds to 452 from the opposite end of the table resulting in the value shown at 610, which is 0.340. Since the cosine value is also negated, the resulting value is −0.340 which is the same as the cosine value at 604.

The corresponding −sine value may be obtained in a similar manner. In this case the −sine values in the second quadrant QUAD1 are negated versions of the stored cosine values. Again, since IDX=2,500 extends into the second quadrant by 452, the value IDX=452 may be used to access a cosine value at 612, which is 0.941. Since the −sine values are also negated, the resulting since value is −0.941 which is the same as the −sine value at 606.

The frequency bin factor n is multiplied by k so that each increment of k results in a translated index value IDX=nk which is a multiple of n. In addition, for the first embodiment using phases of 45°, 135°, 225°, and 315° as shown in FIG. 3, the corresponding sample value x(k) provides a phase adjustment that is used to adjust IDX for accessing a DFT coefficient in the LUT. For the second embodiment using phases of 0°, 90°, 180°, and 270° as shown in FIG. 5, rather than adjust IDX, the phase adjustment may be applied to the retrieved value. In either embodiment, the IDX value (adjusted or not) may be greater than N which would otherwise extend beyond the extent of the waveforms illustrated. It is appreciated, however, that both sinusoidal waveforms simply repeat or otherwise wrap back around to 0 so that a modulo function may be applied to translate the result back to between 0 and N. As an example, a first modulo function based on N may be used to determine the applicable quadrant, and a second modulo function based on N/4 may be used to determine the initial cosine amplitude value when only N/4 DFT coefficients are stored. The quadrant information may then be used to convert the retrieved value into the corresponding cosine and −sine values for each IDX value as previously described. For the second embodiment of FIG. 5, the retrieved cosine and −sine values, representing the real and imaginary components, may then be multiplied by 1, j, −1, or −j as previously described to apply phase adjustment.

Figure 7:
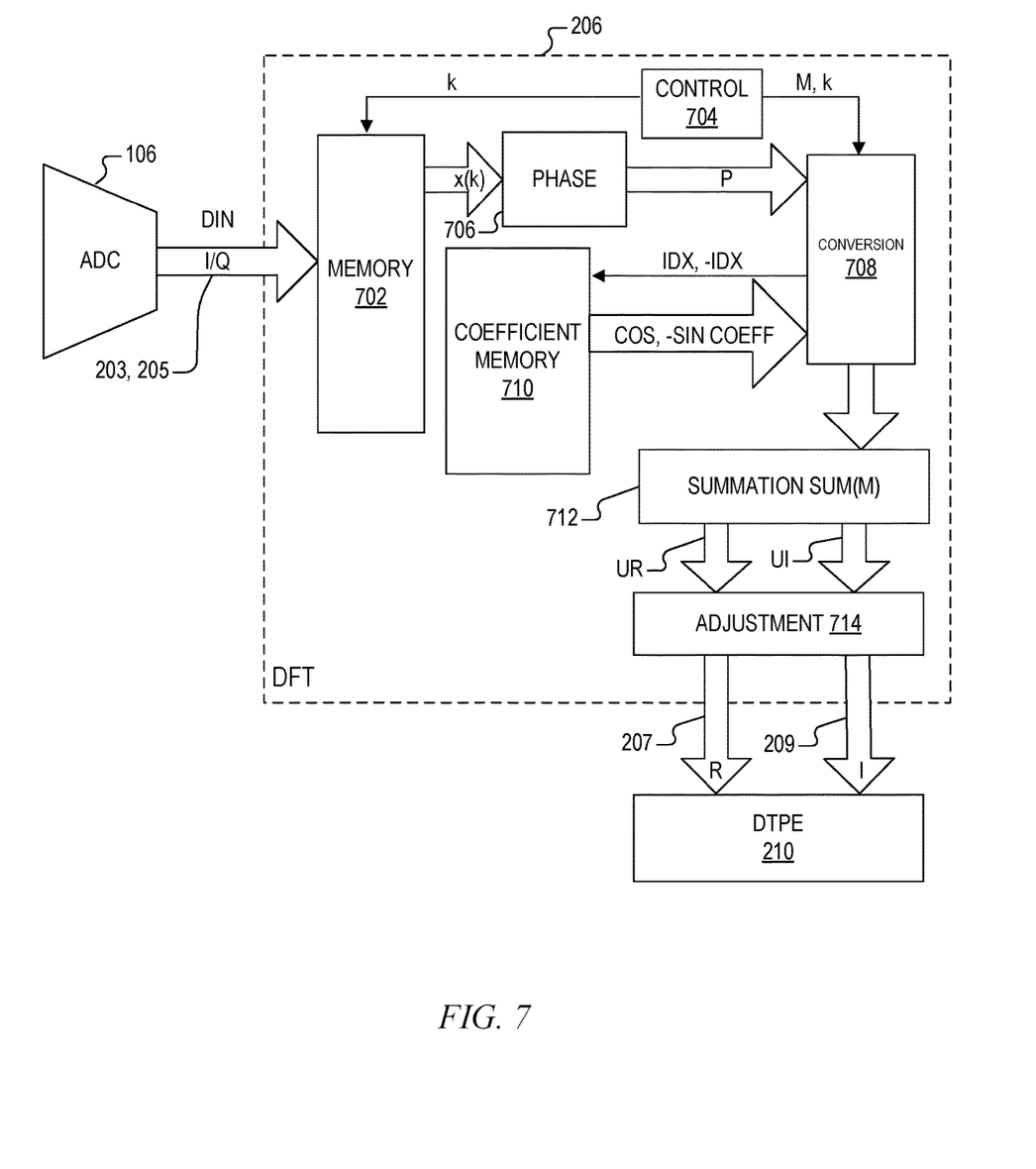
FIG. 7 is a simplified block diagram of the DFT circuitry implemented according to one embodiment of the present disclosure that may be used to implement either of the embodiments of FIGS. 3 and 5.

FIG. 7 is a simplified block diagram of the DFT circuitry 206 implemented according to one embodiment of the present disclosure that may be used to implement either of the embodiments of FIGS. 3 and 5. The DIN signal on the I and Q buses 203 and 205 provide the I and Q samples to a memory 702 within the DFT circuitry 206. The memory 702 may be implemented in any suitable manner, such as one or more random access memory (RAM) devices or the like. The memory 702 may be sized to store at least a predetermined number, such as N samples. Control circuitry 704 controls transform operation for determining a frequency domain value for a selected frequency bin n=M (e.g., M is a selected value of n). During operation in successive clock cycles or the like, the control circuitry 704 provides and increments the k index from 0 to N−1 as previously described. The k index is provided to the memory 702 which outputs a corresponding sample x(k) to phase circuitry 706. The phase circuitry 706 outputs a corresponding phase value P to conversion circuitry 708. P may be an integer from 0 to 3 indicating the relative phase of the x(k) sample, in which P is one of 0, 1, 2, 3 for phases 45°, 135°, 225°, or 315°, respectively, or 0, 1, 2, 3 for phases 0°, 90°, 180°, or 270°, respectively, depending upon the particular embodiment.

The control circuitry 704 provides the M and k values to the conversion circuitry 708, which determines an index value IDX for accessing cosine and −sine frequency coefficients from a coefficient memory 710. The coefficient memory 710 may be configured as an LUT or the like as previously described. The conversion circuitry 708 may initially set IDX=M*k.

For the embodiments in which the samples x(k) indicate phase adjustments of 45°, 135°, 225°, or 315° as shown in FIG. 3, the index value IDX is further modified for phase adjustment by adding a phase offset POFF, or IDX=IDX+POFF. The P value may be converted to POFF=N/8 for a phase of 45°, 3N/8 for a phase of 135°, 5N/8 for a phase of 225°, and 7N/8 for a phase of 315°. For example, for N=8,192, POFF is a selected one of 1,024, 3,072, 5,120, or 7,168. It is noted that N is selected as a multiple of 8 for phases 45°, 135°, 225°, or 315° as shown in FIG. 3, and that N is selected as a multiple of 4 for phases 0°, 90°, 180°, or 270° as shown in FIG. 5.

For the embodiments using phases 0°, 90°, 180°, or 270° as shown in FIG. 5, the initial index value IDX may be adjusted by a phase offset in similar manner (e.g., IDX=IDX+POFF), in which POFF=0 for a phase of 0°, N/4 for a phase of 90°, N/2 for a phase of 180°, and 3N/4 for a phase of 270°. In an alternative embodiment, however, IDX may remain unmodified and used for retrieving the coefficients from the memory 710, in which phase adjustment is applied to the retrieved DFT coefficient as further described herein.

In one embodiment, the coefficient memory 710 stores both cosine and −sine coefficients for the entire set of N samples. Even so, the initial IDX value is further adjusted to be within the range of N in which IDX=IDX % N in which "%" denotes the modulo operation. The index value IDX is applied to the coefficient memory 710, which outputs the corresponding cosine and −sine coefficients to the conversion circuitry 708.

In another embodiment, the coefficient memory 710 stores only the cosine coefficients (or the −sine coefficients) for the entire set of N samples. Again, the initial IDX is adjusted to be within the range of N in which IDX=IDX % N. The index value IDX is applied to the coefficient memory 710, which outputs only one of the cosine or −sine coefficients to the conversion circuitry 708 depending upon which values are stored. To get the other coefficient, the index value is adjusted again by adding N/4, or IDX=IDX+N/4 since the cosine and −sine waveforms are offset from each other by a quarter-wave (and thus one-fourth of N). Since this may place IDX outside of N, the IDX is adjusted using the modulo function again to ensure that it is within the range of N in which IDX=IDX % N. Then IDX is applied again to the coefficient memory 710, which outputs the other cosine or −sine coefficient to the conversion circuitry 708.

In another embodiment, the coefficient memory 710 only stores the quarter-wave cosine coefficients as shown at 608 of FIG. 6. In this case, IDX is used to determine the cosine quadrant in which the initial index IDX falls, or COS_QUAD=INT(IDX/(N/4)) % 4 in which "INT" denotes the integer function. COS_QUAD will be one of 0, 1, 2, or 3 denoting in which one of the quadrants QUAD0, QUAD1, QUAD2, or QUAD3 IDX falls. Suppose, for example, that IDX is 2,500 for N=8,192 as shown in FIG. 6. In this case COS_QUAD=1 denoting quadrant QUAD1. Then IDX is modified to a quadrant offset, IDX=IDX % (N/4). Resuming the same example for IDX of 2,500 and N=8,192, IDX is converted to 452 as previously described for FIG. 6. IDX is applied to the coefficient memory 710 to retrieve a first cosine coefficient value CC[IDX]. IDX is negated to retrieve the first sine coefficient value CC[−IDX].

Then, COS_QUAD is used to determine the cosine and −sine coefficients using the first and second cosine coefficient values CC[IDX] and CC[−IDX]. In particular, if COS_QUAD=0 (first quadrant QUAD0), then the cosine coefficient is CC[IDX], and the −sine coefficient is 0 (if CC[−IDX]=0) or is −CC[−IDX] (if CC[−IDX] is not 0). If COS_QUAD=1 (second quadrant QUAD1), then the cosine coefficient is 0 (if CC[−IDX]=0) or is −CC[−IDX] (if CC[−IDX] is not zero), and the −sine coefficient is −CC[IDX]. If COS_QUAD=2 (third quadrant QUAD2), then the cosine coefficient is −CC[IDX], and the −sine coefficient is 0 (if CC[−IDX]=0) or is CC[−IDX] (if CC[−IDX] is not 0). If COS_QUAD=3 (second quadrant QUAD3), then the cosine coefficient is 0 (if CC[−IDX]=0) or is CC[−IDX] (if CC[−IDX] is not zero), and the −sine coefficient is CC[IDX].

For the embodiments for phases 45°, 135°, 225°, or 315° as shown in FIG. 3, the cosine and −sine values retrieved from the coefficient memory 710 are not further adjusted for the current sample x(k) because the phase offset is applied before coefficient retrieval. For the embodiments using phases 0°, 90°, 180°, or 270° as shown in FIG. 5 in which IDX was not initially adjusted, however, then the cosine and −sine values are further adjusted for phase by multiplying by 1, j, −1 or −j as previously described. In particular, a phase adjustment of 0° means that the retrieved real and imaginary cos/sin components are multiplied by 1 and thus remain unmodified. A phase adjustment of 90° means that the retrieved real and imaginary components are each multiplied by j such that the coefficients are swapped and then the swapped real value (after swapping) is negated (e.g., rotated_coeff_cos=−coeff_sin, and rotated_coeff_sin=coeff_cos). A phase adjustment of 180° means that both of the cosine and −sine components are multiplied by 1 and thus simply negated. A phase adjustment of 270° means that the retrieved cosine and −sine components are multiplied by −j in which the coefficients are swapped and then the swapped imaginary value (after swapping) is negated (e.g, rotated_coeff_cos=coeff_sin, and rotated_coeff_sin=−coeff cosine). In this manner, rather than employing complex math, the DFT coefficients are retrieved from the coefficient table 710 and phase adjustment is applied using simple digital manipulation of the retrieved values.

The respective cosine (real) and −sine (imaginary) coefficients for the current sample x(k) are then added to a running summation SUM(M) by the summation circuitry 712. Generally, the running summation SUM(M) of the real and imaginary components are maintained for the selected frequency bin M for the time-domain x(k) samples retrieved from the memory 702. The summed real value is an "unadjusted" real value UR and the summed imaginary value is an "unadjusted" imaginary value UI. In one embodiment, the UR and UI values are provided to adjustment circuitry 714, which outputs the corresponding real frequency components R on bus 207 and the corresponding imaginary frequency components I on bus 209 to the digital test processing and evaluation (DTPE) circuitry 210 for evaluation and processing.

In the embodiment of FIG. 3 in which the magnitude of $\sqrt{2}$ was temporarily ignored and assumed to be unity (effectively dividing the components by $\sqrt{2}$), the adjustment circuitry 714 may include processing circuitry that multiplies both UR and UI by the scaling factor $\sqrt{2}$ to provide the real and imaginary components R and I. In the embodiment of FIG. 5 in which the values were interpreted or otherwise assumed to be rotated by −45° (or, alternatively, by 45°), and in which the magnitude of $\sqrt{2}$ was temporarily ignored and assumed to be unity, the adjustment circuitry 714 applies the 45° rotation correction and multiplies the result by the scaling factor $\sqrt{2}$ to provide the real and imaginary components R and I. For simplicity, in an alternative embodiment the rotation and/or scaling adjustments may be ignored and handled or otherwise understood during processing and evaluation in the DTPE circuitry 210, in which case UR and UI are directly provided directly without further adjustment.

Figure 8:
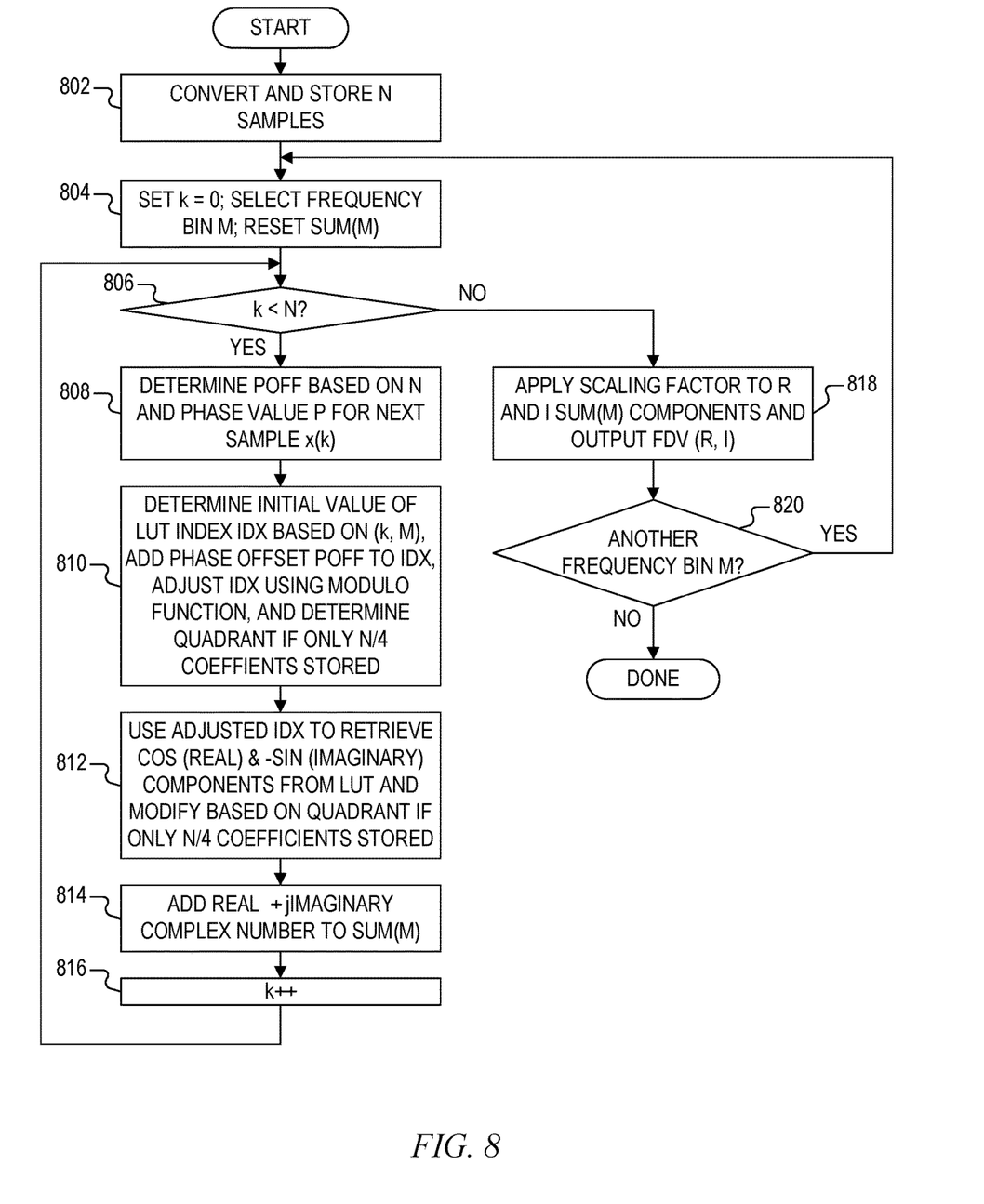
FIG. 8 is a flowchart diagram illustrating operation of the DFT circuitry of FIG. 7 implemented according to the embodiment of FIG. 3 using phases 45°, 135°, 225°, and 315°.

FIG. 8 is a flowchart diagram illustrating operation of the DFT circuitry 206 shown in FIG. 7 implemented according to the embodiment of FIG. 3 using phases 45°, 135°, 225°, and 315°. At first block 802, N I, Q samples are converted by the ADC 106 and stored in the memory 702. At next block 804, index k is initialized to 0, a frequency bin M (n=M) is selected, and the complex running summation value SUM(M) for the selected frequency bin M is reset. At next block 806, it is queried whether k is less than N. Since k is initially set to zero which is less than N, operation advances to block 808 in which the phase circuitry 706 determines the phase offset POFF based on the number of samples N and the phase value P received for the next sample x(k). The phase offset POFF is N/8 for 45°, 3N/8 for 135°, 5N/8 for 225°, and 7N/8 for 315°. It is noted that the actual samples are not retrieved or directly used for computation, but instead only the corresponding phase value P is provided for determining a corresponding phase offset POFF.

Operation advances to block 810 in which an initial value of IDX used as an index into the coefficient memory 710 configured as an LUT table, is determined based in the value of k and the selected value of M. The initial value of IDX may be, for example, IDX=k*M. It is noted that actual multiplication is not necessary since for each subsequent increment of k, the previous IDX can simply be incremented by M (e.g., as k is incremented from 0 to N−1, IDX is 0, M, 2M, 3M, . . . , M(N−1)). The initial IDX value is then modified by adding the phase offset POFF. In addition, IDX is further adjusted using the modulo function to ensure IDX is within N if a full set of cosine and −sine values are stored in the LUT, or to ensure IDX is within N/4 is only N/4 coefficients are stored. In addition, if only N/4 coefficients are stored, then the modulo function is also used as previously described to determine one of the four the quadrants QUAD0-QUAD3 as previously described.

At next block 812, the adjusted IDX is used to retrieve the cosine (real) and −sine (imaginary) components from the coefficient memory 710. In one embodiment in which a full set of cosine and −sine values are stored in the coefficient memory 710, then only one memory access is needed providing both the real and imaginary components. In another embodiment in which a full set of only the cosine or −sine values are stored, two memory accesses may be made as previously described. In another embodiment in which only N/4 samples are store for the cosine coefficients, such as including the quarter-quadrant shown at 608 in FIG. 6, two memory accesses may be made using IDX and −IDX to access 2 component values. The component values may be adjusted based on the quadrant determination as previously described to convert the retrieved values into the actual coefficient values of the frequency domain value.

Once the actual discrete frequency component is determined for the current sample x(k), operation advances to block 814 in which the real and imaginary component values are added into the SUM(M) value. Operation then advances to block 816 in which the k index value is incremented (e.g., k++), and operation loops back to block 806 to determine whether k has reached N. If k is still less than N, then operation loops between blocks 806 to 816 to determine each discrete frequency component pair for each of the N samples x(k) and to update SUM(M). Once completed, then SUM(M) is the unscaled frequency domain value for the selected frequency bin M, and operation advances instead to block 818 in which any applicable scaling factor, such as $\sqrt{2}$, is applied to the real and imaginary components of SUM (M), and the frequency domain value (FDV), which includes a real component R and an imaginary component I, or FDV (R, I), is output to the DTPE circuitry 210. Operation then advances to block 820 to query whether a frequency domain value should be determined for another frequency bin M. If so, operation loops back to block 804 previously described. If not, operation is completed.

Figure 9:
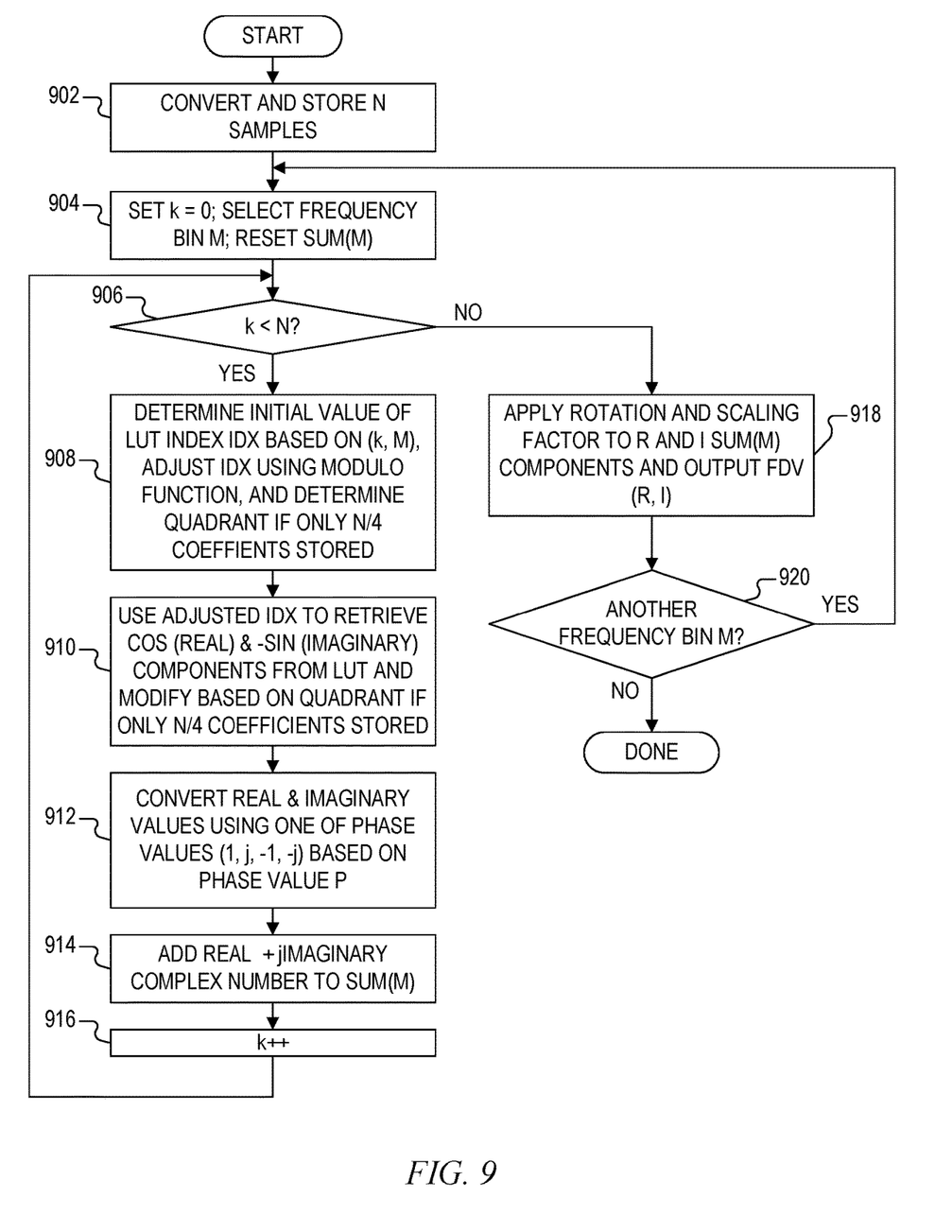
FIG. 9 is a flowchart diagram illustrating operation of the DFT circuitry of FIG. 7 implemented according to the embodiment of FIG. 5 using phases 0°, 90°, 180°, and 270° in which IDX is not adjusted according to one embodiment of the present disclosure.

FIG. 9 is a flowchart diagram illustrating operation of the DFT circuitry 206 shown in FIG. 7 implemented according to the embodiment of FIG. 5 using phases 0°, 90°, 180°, and 270° in which IDX is not adjusted according to one embodiment of the present disclosure. At first block 902, N I, Q samples are converted by the ADC 106 and stored in the memory 702 similar to block 802. At next block 904, index k is initialized to 0, a frequency bin M (n=M) is selected, and a complex summation value SUM(M) for the selected frequency bin M is reset similar to block 804. At next block 806, it is queried whether k is less than N similar to block 806. Since k is initially set to zero which is less than N, operation advances to block 908, similar to block 810, in which an initial value of IDX used as an index into the coefficient memory 710 is determined based in the value of k and the selected value of M. The initial value of IDX may be, for example, IDX=k*M. In the illustrated embodiment of FIG. 9, the initial IDX value is not further modified by a phase offset in this case. IDX is, however, adjusted using the modulo function to ensure IDX is within N if a full set of cosine and −sine values are stored in the LUT, or to ensure IDX is within N/4 is only N/4 coefficients are stored. In addition, if only N/4 coefficients are stored, then the modulo function is also used as previously described to determine one of the four the quadrants QUAD0-QUAD3 as previously described.

At next block 910, similar to block 812, IDX is used to retrieve the cosine (real) and −sine (imaginary) components from the coefficient memory 710. In one embodiment in which a full set of cosine and −sine values are stored in the coefficient memory 710, then only one memory access is needed providing both the real and imaginary components. In another embodiment in which a full set of only the cosine or −sine values are stored, two memory accesses may be made as previously described. In another embodiment in which only N/4 samples are store for the cosine coefficients, such as including the quarter-quadrant shown at 608 in FIG. 6, two memory accesses may be made using IDX and −IDX to access 2 component values. The component values may be adjusted based on the quadrant determination as previously described to convert the retrieved values into the actual coefficient values of the frequency domain value.

Operation then advances to block 912 in which the frequency components retrieved from the table and adjusted, if necessary, based on the quadrant information may further be converted based on the phase value P. If P indicates a 0° phase, then the frequency components are not modified since multiplied by 1. If P indicates a 90° phase, then the frequency components are each multiplied by j in which the coefficients are swapped (imaginary coefficient becomes the real coefficient and vice-versa) and the real coefficient is negated as previously described. If P indicates a 180° phase, then the frequency components are both negated since multiplied by −1. If P indicates a 270° phase, then the frequency components are each multiplied by −j in which the coefficients are swapped (imaginary coefficient becomes the real coefficient and vice-versa) and the imaginary coefficient is negated as previously described.

Once the actual frequency components are determined for the current sample x(k), operation advances to block 914, similar to block 814, in which the real and imaginary component values are added into the SUM(M) value. Operation then advances to block 916 in which the k index value is incremented (e.g., k++) similar to block 816, and operation loops back to block 906 to determine whether k has reached N. If k is still less than N, then operation loops between blocks 906 to 916 to determine each discrete frequency component pair for each of the N samples x(k) and to update SUM(M). Once completed, then SUM(M) is a rotated and scaled frequency domain value for the selected frequency bin M, and operation advances instead to block 918 in which SUM(M) may be rotated back and then scaled to provide the final frequency domain value FDV (R, I). For example, the result is rotated back by 45° and then scaled by $\sqrt{2}$. The final FDV value is output to the DTPE circuitry 210.

Operation then advances to block 920 to query whether another frequency domain value should be determined for another frequency bin M. If so, operation loops back to block 904 previously described. If not, operation is completed.

Figure 10:
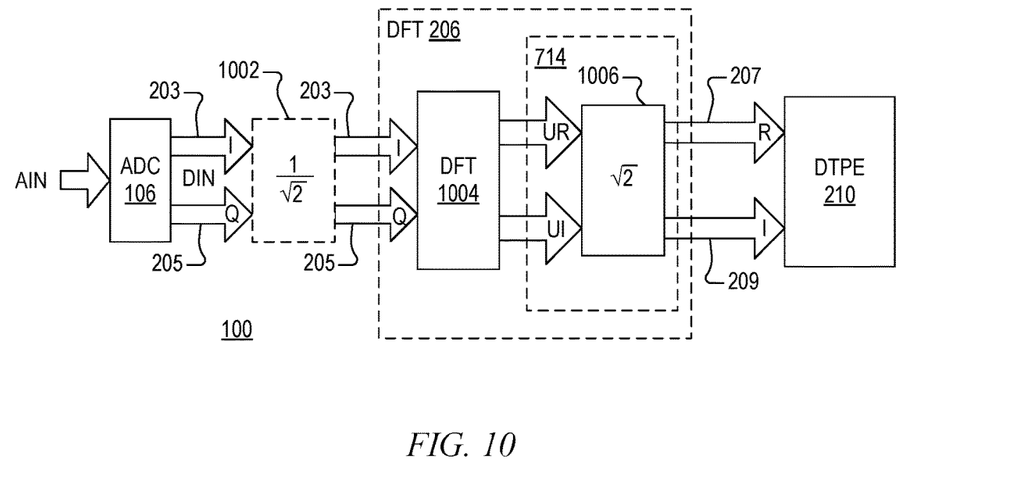
FIG. 10 is a simplified block diagram of a portion of the receiver of FIG. 1 from the ADC of FIG. 1 to the DTPE circuitry of FIG. 2 illustrating further details of the adjustment circuitry for implementing the embodiment of FIG. 3 according to one embodiment of the present disclosure.

FIG. 10 is a simplified block diagram of a portion of the receiver 100 from the ADC 106 to the DTPE circuitry 210 of the test circuitry 110 illustrating further details of the adjustment circuitry 714 for implementing the embodiment of FIG. 3 according to one embodiment of the present disclosure. The ADC 106 converts the AIN signal to DIN signal including I and Q samples provided on I and Q buses 203 and 205, respectively, which are provided through a virtual scaling circuit 1002. The scaling circuit 1002 is "virtual" and shown using dashed lines to represent virtual magnitude scaling of $1/\sqrt{2}$ in which the magnitude of the collective I/Q outputs are interpreted as having unity magnitudes rather than the actual magnitudes of $\sqrt{2}$. Thus, the I and Q samples provided on I and Q buses 203 and 205, respectively, are provided directly to respective inputs of DFT circuitry 1004 within the DFT circuitry 206. The DFT circuitry 1004 includes that portion of the DFT circuitry 206 from the memory 702 up to and including the summation circuitry 712 shown in FIG. 7 but not including the adjustment circuitry 714.

The UR and UI values at the outputs of the DFT circuitry 1004 (e.g., outputs of the summation circuitry 712) are provided to respective inputs of the adjustment circuitry 714 configured as scaling circuitry 1006. The scaling circuitry 1006 multiplies each of the UR and UI values by the scaling factor (e.g., $\sqrt{2}$) to provide the corresponding real and imaginary FDV components R and I on buses 207 and 209, respectively, to the DTPE circuitry 210 for evaluation and processing as previously described. It is appreciated that in an alternative embodiment the scaling circuitry 1006 may be bypassed or even omitted in which scaling adjustment is handled or otherwise ignored or understood during processing and evaluation in the DTPE circuitry 210, in which case UR and UI are directly provided directly without further adjustment.

Figure 11:
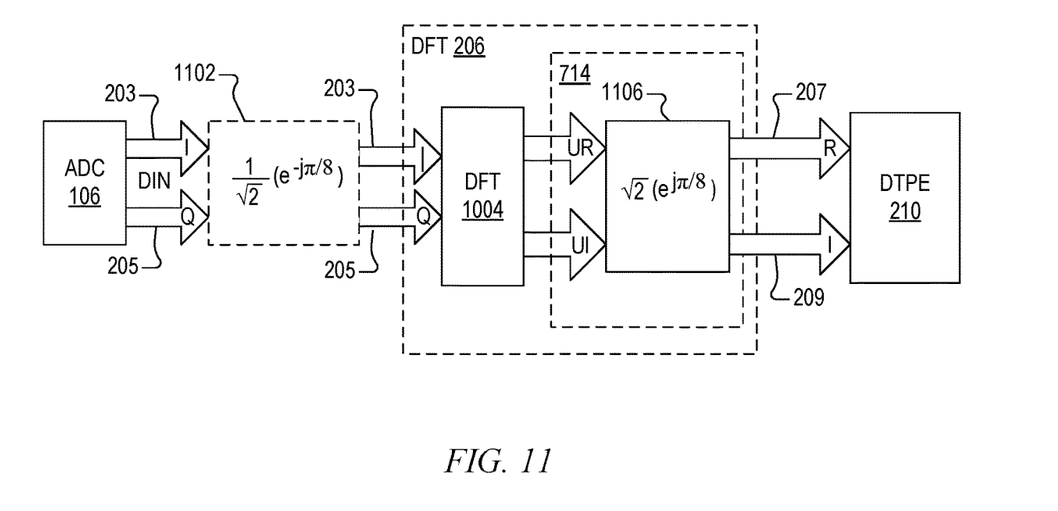
FIG. 11 is a simplified block diagram of a portion of the receiver of FIG. 1 from the ADC to the DTPE circuitry of FIG. 2 of the test circuitry of FIG. 1 illustrating further details of the adjustment circuitry of FIG. 7 according to one embodiment for implementing the embodiment of FIG. 5.

FIG. 11 is a simplified block diagram of a portion of the receiver 100 from the ADC 106 to the DTPE circuitry 210 of the test circuitry 110 illustrating further details of the adjustment circuitry 714 according to one embodiment for implementing the embodiment of FIG. 5. The ADC 106 converts the AIN signal to DIN signal including I and Q samples provided on I and Q buses 203 and 205, respectively, which are provided through a virtual rotation and scaling circuit 1102. In a similar manner as described for the scaling circuit 1002, the rotation and scaling circuit 1102 is also virtual and shown using dashed lines to represent virtual magnitude scaling of $1/\sqrt{2}$ and virtual rotation adjustment of −45°. A rotation of −45° is shown in radian format as $e^{-j\pi/8}$. Thus, the I and Q samples provided on I and Q buses 203 and 205, respectively, are provided directly to respective inputs of the DFT circuitry 1004 within the DFT circuitry 206 up to and including the summation circuitry 712 shown in FIG. 7 but not including the adjustment circuitry 714.

The UR and UI values at the outputs of the DFT circuitry 1004 (e.g., outputs of the summation circuitry 712) are provided to respective inputs of the adjustment circuitry 714 configured as scaling and rotation circuitry 1106. The scaling and rotation circuitry 1106 rotates the UR and UI values by 45° (shown in radian format as $e^{j\pi/8}$) and then the magnitude of the resulting value is multiplied by the scaling factor (e.g., $\sqrt{2}$) to provide the corresponding FDV real and imaginary frequency components R and I on buses 207 and 209, respectively, to the DTPE circuitry 210 for evaluation and processing as previously described.

It is noted that rotation by 45° such as multiplying by the radian value $e^{j\pi/8}$ and then multiplication by the scaling factor of $\sqrt{2}$ may be implemented by simple addition and subtraction rather than multiplication. For example, assume a complex value UR+jUI at the output of the DFT 1004. Applying a rotation of 45° may be achieved by multiplying by $e^{j\pi/8}$ which is the same as multiplying by a complex value $1/\sqrt{2}+j(1/\sqrt{2})$ which results in the value $(UR-UI)/\sqrt{2}+j(UR+UI)/\sqrt{2}$. Then multiplying each component by $\sqrt{2}$ results in a final value of (UR−UI)+j(UR+UI). In this manner, the R+jI output of the scaling and rotation circuitry 1106 is simply (UR−UI)+jUR+UI) in which R=UR−UI and I=UR+UI. In this manner, the scaling and rotation circuitry 1106 may be implemented as simple summation circuitry for providing the real and imaginary frequency components R and I of the frequency domain value FDV for the selected frequency bin M.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A system for performing discrete frequency transform, comprising:
    first and second single-bit analog to digital converters for converting an analog input signal into N pairs of binary in-phase and quadrature component samples, wherein N is a predetermined number of samples and wherein each of the N pairs of binary in-phase and quadrature phase component samples comprises one of four values with a corresponding one of four phases;
    a phase converter that determines a phase value for each of the N pairs of binary in-phase and quadrature phase component samples;
    a memory that stores a plurality of discrete frequency transform coefficient values based on N;
    a discrete frequency transform converter that uses a corresponding phase value and a corresponding pair of discrete frequency transform coefficient values retrieved from the memory for a selected frequency bin to determine a corresponding discrete frequency component for each of the N pairs of binary in-phase and quadrature phase component samples; and
    summation circuitry that sums the corresponding N frequency domain components to provide a complex summation value used for determining a frequency domain value for the selected frequency bin.

2. The system of claim 1, wherein the discrete frequency transform converter determines an initial index into the memory for a corresponding discrete frequency transform coefficient, adjusts the index by adding a phase offset to the initial index based on the phase value to determine an adjusted index, and retrieves a real transform coefficient value and a corresponding imaginary transform coefficient value from the memory using the adjusted index.

3. The system of claim 2, wherein the memory stores N/4 real transform coefficient values each corresponding one of N/4 component samples, wherein the discrete frequency transform converter applies a first modulo function to the adjusted index to determine a quadrant value, applies a second modulo function to the adjusted index to determine a quarter-wave index, uses the quarter-wave index and negated version of the quarter-wave index to retrieve first and second components from the memory, and uses the quadrant value to determine the real transform coefficient value and the corresponding imaginary transform coefficient value.

4. The system of claim 1, wherein each of the first and second single-bit analog to digital converters outputs a binary value 1 or −1, wherein each pair of binary in-phase and quadrature component samples comprises one of [1, 1] at a phase of 45 degrees, [−1, 1] at a phase of 135 degrees, [−1, −1] at a phase of 225 degrees, and [1, −1] at a phase of 315 degrees, each having a magnitude of $\sqrt{2}$.

5. The system of claim 4, wherein the complex summation value comprises a real component and an imaginary component, further comprising scaling circuitry that multiplies each of the real component and the imaginary component by $\sqrt{2}$.

6. The system of claim 1, wherein the discrete frequency transform converter determines an index into the memory for a corresponding discrete frequency transform coefficient, retrieves a real transform coefficient value and a corresponding transform coefficient imaginary value from the memory using the index, and selectively adjusts the real transform coefficient value and the imaginary transform coefficient value based on the phase value.

7. The system of claim 6, wherein the memory stores N/4 real transform coefficient values each corresponding one of N/4 component samples, wherein the discrete frequency transform converter applies a first modulo function to the index to determine a quadrant value, applies a second modulo function to the index to determine a quarter-wave index, and uses the quarter-wave index and negated version of the quarter-wave index to retrieve first and second components from the memory.

8. The system of claim 7, wherein the discrete frequency transform determines the real transform coefficient value and the imaginary transform coefficient value by using the retrieved first and second components retrieved from the memory for a phase value of 1, swaps the first and second components and then negates the real component for a phase of j, negates both the first and second components for a phase of −1, and swaps the first and second components and then negates the imaginary component for a phase of −j.

9. The system of claim 1, wherein each of the first and second single-bit analog to digital converters outputs a binary value 1 or −1, wherein each pair of binary in-phase and quadrature component samples is rotated by −45 degrees to comprise one of [1, 0] at a phase of 0 degrees, [0, 1] at a phase of 90 degrees, [−1, 0] at a phase of 180 degrees, and [0, −1] at a phase of 270 degrees.

10. The system of claim 9, wherein the complex summation value comprises a real component and an imaginary component, further comprising scaling and rotation circuitry that provides the frequency domain value by subtracting the imaginary component of the complex summation value from the real component of the complex summation value to provide a real component of the frequency domain value, and by adding the real and imaginary components of the complex summation value to provide an imaginary component of the frequency domain value.

11. The method of claim 1, further comprising determining an index into the memory for a corresponding discrete frequency transform coefficient, retrieving a real transform coefficient value and a corresponding transform coefficient imaginary value from the memory using the index, and selectively adjusting the real transform coefficient value and the imaginary transform coefficient value based on the phase value.

12. The method of claim 11, wherein the storing comprising storing N/4 real transform coefficient values each corresponding one of N/4 component samples, further comprising applying a first modulo function to the index for determining a quadrant value, applying a second modulo function to the index for determining a quarter-wave index, and using the quarter-wave index and negated version of the quarter-wave index for retrieving first and second components from the memory.

13. The method of claim 12, further comprising determining the real transform coefficient value and the imaginary transform coefficient value by using the retrieved first and second components retrieved from the memory for a phase value of 1, swapping the first and second components and then negating the real component for a phase of j, negating both the first and second components for a phase of −1, and swapping the first and second components and then negates the imaginary component for a phase of −j.

14. A method of performing discrete frequency transform, comprising:
  converting an analog input signal into N pairs of binary in-phase and quadrature component samples, wherein N is a predetermined number of samples and wherein each of the N pairs of binary in-phase and quadrature phase component samples comprises one of four values with a corresponding one of four phases;
  determining a phase value for each of the N pairs of binary in-phase and quadrature phase component samples;
  storing a plurality of discrete frequency transform coefficient values based on N;
  using a corresponding phase value and a corresponding pair of discrete frequency transform coefficient values retrieved from the memory for a selected frequency bin for determining a corresponding discrete frequency component for each of the N pairs of binary in-phase and quadrature phase component samples; and
  summing the corresponding N frequency domain components for providing a complex summation value used for determining a frequency domain value for the selected frequency bin.

15. The method of claim 14, further comprising determining an initial index into the memory for a corresponding discrete frequency transform coefficient, adjusting the index by adding a phase offset to the initial index based on the phase value for determining an adjusted index, and retrieving a real transform coefficient value and a corresponding imaginary transform coefficient value from the memory using the adjusted index.

16. The method of claim 15, wherein the storing comprising storing N/4 real transform coefficient values each corresponding one of N/4 component samples, further comprising applying a first modulo function to the adjusted index for determining a quadrant value, applying a second modulo function to the adjusted index for determining a quarter-wave index, using the quarter-wave index and negated version of the quarter-wave index for retrieving first and second components from the memory, and using the quadrant value for determining the real transform coefficient value and the corresponding imaginary transform coefficient value.

17. The method of claim 14, wherein the converting comprises providing a binary value 1 or −1 so that each pair of binary in-phase and quadrature component samples comprises one of [1, 1] at a phase of 45 degrees, [−1, 1] at a phase of 135 degrees, [−1, −1] at a phase of 225 degrees, and [1, −1] at a phase of 315 degrees, each having a magnitude of $\sqrt{2}$.

18. The method of claim 17, wherein the complex summation value comprises a real component and an imaginary component, further comprising multiplying each of the real component and the imaginary component by $\sqrt{2}$.

19. The method of claim 14, wherein the converting comprises providing a binary value 1 or −1, further comprising rotating each pair of binary in-phase and quadrature component samples by −45 degrees to comprise one of [1, 0] at a phase of 0 degrees, [0, 1] at a phase of 90 degrees, [−1, 0] at a phase of 180 degrees, and [0, −1] at a phase of 270 degrees.

20. The method of claim 19, wherein the complex summation value comprises a real component and an imaginary component, further comprising providing the frequency domain value by subtracting the imaginary component of the complex summation value from the real component of the complex summation value for providing a real component of the frequency domain value, and by adding the real and imaginary components of the complex summation value for providing an imaginary component of the frequency domain value.

* * * * *